United States Patent [19]

Winters

[11] 4,139,823

[45] Feb. 13, 1979

[54] ELECTRICAL ENERGY TRANSMISSION NETWORK

[76] Inventor: Paul N. Winters, P.O. Box 327, Trumann, Ark. 72472

[21] Appl. No.: 816,813

[22] Filed: Jul. 18, 1977

[51] Int. Cl.² .......................... H03B 1/04; H04B 1/12
[52] U.S. Cl. ................................ 328/155; 328/163; 325/476
[58] Field of Search ................. 328/55, 155, 140, 165, 328/162, 163; 179/1 P; 325/475, 476

[56] References Cited

U.S. PATENT DOCUMENTS

| 3,737,783 | 6/1973 | Oswald et al. ........................ 325/476 |
| 3,863,159 | 1/1975 | Coulter et al. ........................ 328/163 |
| 4,008,439 | 2/1977 | Schroeder ............................. 328/163 |
| 4,075,566 | 2/1978 | D'Arcangelis ......................... 325/476 |

Primary Examiner—John S. Heyman

[57] ABSTRACT

The delay elements of a signal energy transmission network are divided into separate portions through which the transmitted energy is phase shifted by substantially equal amounts. A phase correction circuit reverses the phase shift through one of the divided delay portions by subtracting the delayed signal from the input signal of that portion to obtain a phase error signal, and then modulating the undelayed signal input to that portion with the phase error signal to reverse the phase shift caused by that same portion, so that the effect of the remaining delay portion on the phase is thereby cancelled in order to maintain a constant frequency vs. phase relationship.

9 Claims, 4 Drawing Figures

ELECTRICAL ENERGY TRANSMISSION NETWORK

BACKGROUND OF THE INVENTION

This invention relates to phase correcting circuits for energy transmission networks having delay elements therein, and is related to patent application Ser. No. 787,373 filed Apr. 14, 1977, titled ELECTRICAL ENERGY TRANSMISSION NETWORK; being an alternate method of accomplishing the objects therein, and offering certain flexibilities of operation not possible with the previously referred to application, which shall subsequently become apparent.

SUMMARY OF THE INVENTION

In accordance with the present invention an energy transmission network having energy storing delay elements therein through which a sinusoidally varying current is transmitted, is modified so as to divide the delay elements into separate portions through which phase shift occurs by equal amounts over a given cyclic period. The separate delay portions are interconnected in series with a phase correcting circuit between the input and output terminals of the network so as to effect sequential phase shift while performing the delay function. The phase correcting circuit is operative to reverse the phase shift through one of the separate delay portions by subtracting the signal delayed by only one of the separate delay portions from its input signal to obtain a phase error signal, which is then modulated onto the said input signal to reverse the effective phase shift through said delay portion, so that the phase function of the remaining delay portion will exactly cancel the resulting phase shift. The above operations are carried out using single-sideband techniques in order to reduce filtering requirements and in order to correct phase differences up to + or − 180 degrees or multiples thereof without ambiguity. The transmission network so modified becomes a constant-phase delay network which behaves differently from ordinary delay circuits when used in combination with other components to perform integration for example.

Cognizance is taken of the fact that it is possible to use other frequency ratios and other ratios of the separate delay portions which will also perform the constant-phase delay function when used in the proper combinations; also that it is possible to avoid the use of single-sideband techniques by suitable frequency translations and filtering techniques, and it is therefore an object of the present invention to include such frequency translations, filtering techniques, and various frequency ratios and delay portion ratios without, however, naming them specifically, falling within the scope of the invention.

The described technique, together with other objects and advantages which will subsequently become apparent, reside in the details of construction and operation as more fully hereinafter described and claimed, reference being had to the accompanying drawings forming a part hereof, wherein like numerals refer to like parts throughout.

DETAILED DESCRIPTION OF PREFERRED EMBODIMENTS

Figure 1:
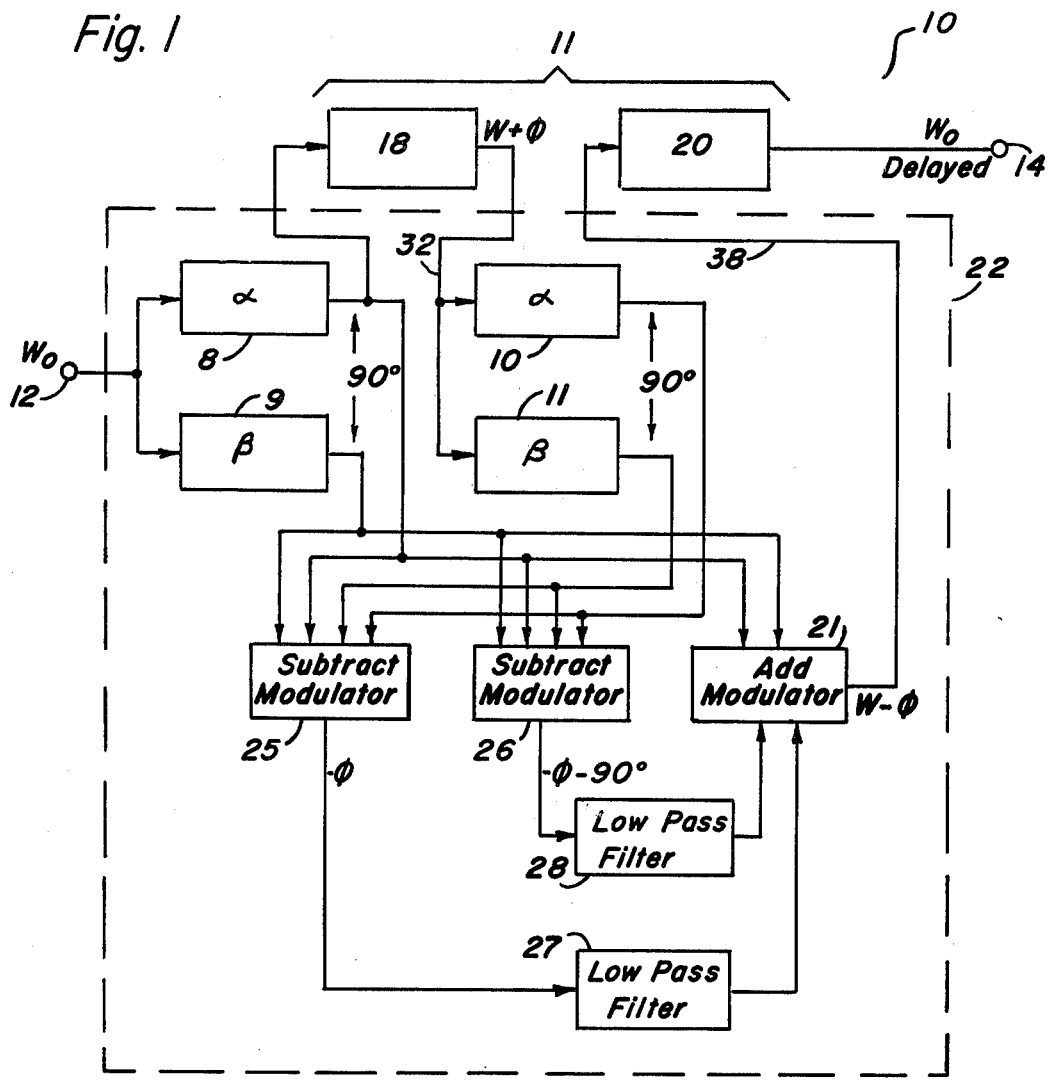
FIG. 1 is a schematic block diagram showing a constant-phase delay network in accordance with the present invention for handling one class of signals.

Referring now to the drawings in detail, FIG. 1 diagrammatically illustrates one form of constant-phase delay network generally referred to by reference numeral 10 arranged in accordance with the present invention. In this type of energy transmission network, electrical signal energy that is sinusoidally varied is applied to the input terminal 12 of the network. Modulation components associated with the sinusoidally varied signal, if present, are assumed to change slowly when compared to the total delay of the energy transmission network. A time delayed output signal is obtained at the output terminal 14 with a net change in phase substantially equal to zero. In accordance with the present invention, the delay elements 11 associated with the transmission network is divided into two portions 18 and 20 as shown in FIG. 1 interconnected in series by a phase-correcting circuit generally referred to by reference numeral 22. The divided portions 18 and 20 will accordingly produce a signal delay ordinarily associated with energy storing delay elements without, however, any net change in phase of the transmitted energy. Each divided portion 18 and 20 will itself produce a change in phase in the same direction denoted by $\phi$ with respect to the phase of the input signal, designated in FIG. 1 as Wo. In the embodiment illustrated in FIG. 1, both divided portions 18 and 20 of the delay elements phase shift the signal by equal amounts $\phi$ for what is ordinarily a total phase shift of $2\phi$.

The phase correcting circuit 22 includes subtracting modulators 25 and 26 of the single-sideband type to which are fed the signals from the input and output of one of the divided delay portions through the 90 degree networks 8 and 9, and 10 and 11 respectively. The phase-shift caused by the 90 degree networks is effectively cancelled out so far as the outputs of the subtracting modulators 25 and 26 are concerned. The operation of such modulators is described in a paper titled "Quadrature Signal Processing Techniques" which was published in the 1968 Wescon Technical Papers, Session 12, New Developments in Digital Communications; however, the operation of the present invention is not restricted to the use of such modulators as therein described. The subtracting modulators are so connected as to produce phase/frequency error information appearing across delay portion 18 between input and output in quadrature. The amplitude of the resulting signals is proportional to the input amplitudes and their vector sum describes the angle of the error signal, the resulting angles being denoted by $-\phi$ and $-\phi - 90$ degrees respectively. These signals are then applied to low-pass filters 27 and 28 which are inserted to control the slew rate, attack and decay rates of the error signals, and also to reduce noise or other unwanted signal components which may be associated with the error signals which fall outside the passband of the low-pass filters 27 and 28. The resulting filtered error signals are then applied to adding modulator 21. The other inputs to modulator 21 come from input terminal 12 through the 90 degree networks 8 and 9. The error signals thus shift the phase at the output of said modulator 21 in an additive direction, as described in the previously referred-to paper. The ouput of modulator 21 is fed to the remaining delay portion 20, which substantially cancels the phase-shift appearing at the output of modulator 21.

It is helpful in understanding the operation to assume that the input signal is changing slowly at a constant rate. For purposes of illustration only, delay portions having a delay of one second are assumed and the input signal is assumed to be increasing at a 1 Hertz rate. Thus the difference in phase between the input and output of delay portion 18 is increasing at a 1 Hertz rate and therefore the outputs of subtracting modulators 27 and 28 when added vectorially will rotate at a 1 Hertz rate. If the signal at the input terminal 12 is presently 1,000 Hertz, modulator 21 will add the 1 Hertz error component to the 1,000 Hertz component to produce 1,001 Hertz which, when delayed by one second in delay portion 20, will be in-phase with the input signal which simultaneously arrives at 1,001 hertz.

If the error signals do not have frequency components which can pass through the low-pass filters 27 and 28, no output can appear at the output terminal 14. Thus, in the example given, if the low-pass filters have a cutoff frequency below 1 Hertz, there will be little or no output at the output terminal 14. Thus it is possible to pass or attenuate signals at any frequency within the design range depending upon the characteristics of the low-pass filters 27 and 28 and the steady-state characteristics of the applied signals.

Figure 2:
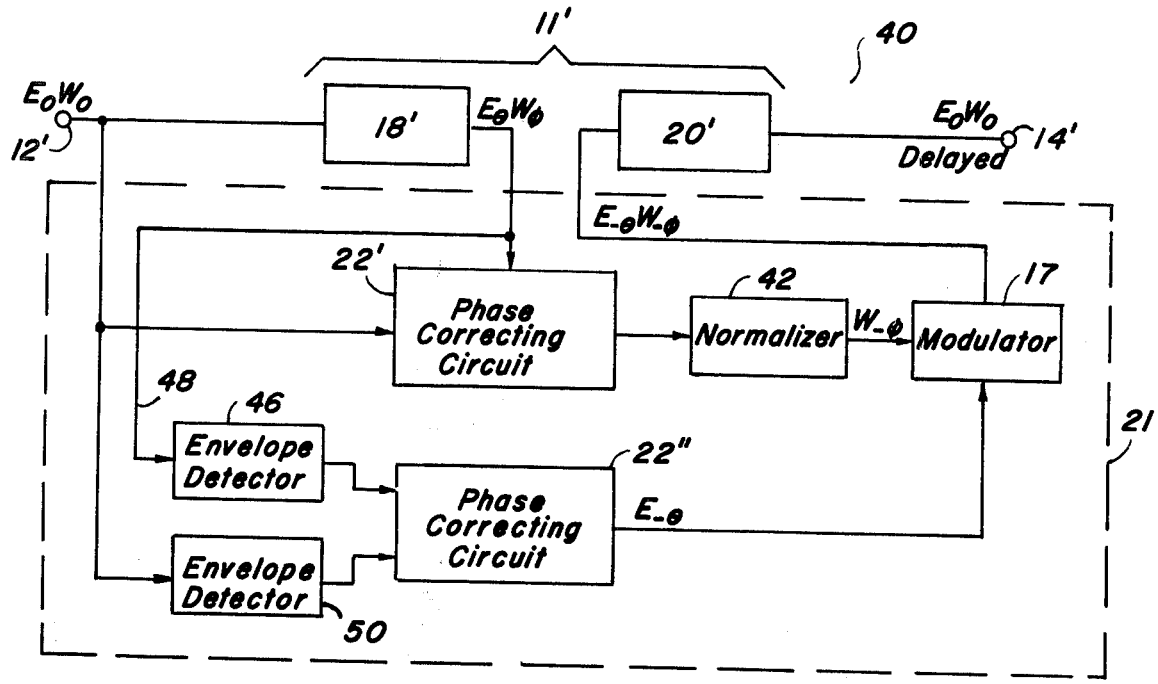
FIG. 2 is a schematic block diagram showing a constant-phase delay network incorporating the constant-phase feature twice for handling more complex signals such as modulated carriers.

FIG. 2 illustrates another energy transmission network generally referred to by reference numeral 40 in which the delay elements 11' of the network are again divided into separate portions 18' and 20' between input terminal 12' and output terminal 14'. A phase correcting circuit 21 with which the network is associated, is designed to handle more complex signals such as voice, and modulated carriers as examples, assumed to change slowly as compared to the total delay period associated with the divided delay portions 18' and 20' of the network. Such complex signals are regarded as including two frequency components consisting of the instantaneous frequency W and the envelope frequency E. Thus, the circuit 40 not only maintains a constant phase with respect to the instantaneous frequency W but also with respect to the envelope frequency E. The phase-correcting circuit 22' performs the same function as the phase-correcting circuit 22 of FIG. 1 and contains the same functional parts, interconnected in the same fashion, whose purpose is to provide a corrected phase of the instantaneous frequency W, which is in turn normalized by normalizer 42. The output of normalizer 42 is therefore $W \angle -\phi$. Envelope detectors 46 and 50 detect the envelope frequency components of the input and output of delay portion 18' and provide the input signals to phase-correcting circuit 22" which contains the same functional parts, interconnected in the same fashion and having suitable design frequencies, as the phase-correcting circuit 22 of FIG. 1. The output of the phase-correcting circuit 22" is therefore the phase-corrected signal $E \angle -\theta$ which is applied to modulator 17 as one input. The other input to modulator 17 is the normalizer 42 output $W \angle -\phi$. The modulator 17 therefore delivers the output signal $(E \angle -\theta)(W \angle -\phi)$, which is fed to the remaining delay portion 20'. The phase function of the delay portion 20 is complementary to the applied input for both frequency terms $E \angle -\theta$ and $W \angle -\phi$, and therefore the output of delay portion 20' is EoWo delayed at output terminal 14'.

Figure 3:
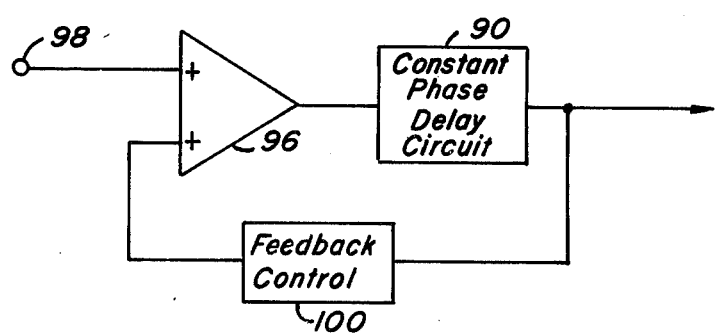
FIG. 3 is a schematic block diagram showing a constant-phase delay network having integration capabilities.

In FIG. 3, a constant-phase circuit 90 has its input connected to the output of a summing device 96 to which one input is applied from terminal 98. The output of circuit 90 is connected through a feedback control component 100 to the other input of the summing device 96 in order to perform an integration operation. In the arrangement depicted in FIG. 3, an improvement in signal-to-noise ratio can occur if the feedback factor associated with the feedback control 100 is less than unity and greater than zero. Signal components, being in-phase at the summing point, add constructively whereas noise components, being random in nature and generally different in phase because of the delay associated with the network, add to a much smaller degree.

Figure 4:
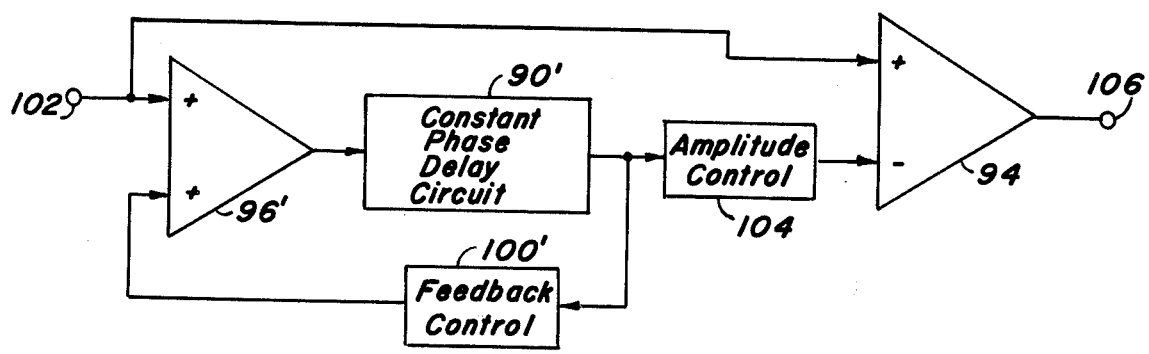
FIG. 4 is a schematic block diagram showing an arrangement using a constant-phase delay network which is capable of passing a band of frequencies, such as voice frequencies, while rejecting other frequencies within the band, such as externally applied feedback components.

FIG. 4 is a schematic block diagram showing a constant-phase delay circuit having antifeedback capabilities. The constant-phase delay circuit 90' output is fed back into the input in an amount controlled by feedback control 100', where it is summed in summing circuit 96' with the input signal applied to input terminal 102. The output of the constant-phase circuit 90' is summed differentially with the input signal from input terminal 102 in differential amplifier 94. Any gain difference between the two signals is adjusted by amplitude control 104 such that when a steady signal is applied to input terminal 102, the differentially summing amplifier 94 effectively cancels the signals appearing at its inputs to produce little or no output. If now the low-pass filters of the constant-phase delay circuit, referred to in FIG. 1 as Low Pass Filters 27 and 28, are adjusted to have frequency cut-off characteristics below that required to pass normally sustained phase error signals such as might be encountered in normal speech for example, then such speech signals will not pass through the constant-phase delay circuit 90' nor the amplitude control 104, and therefore the speech signals will be applied directly from the input terminal 102 through summing stage 94 to the output terminal 106. If now the arrangement depicted by FIG. 4 is placed in the microphone lead of a public address system for example, any external feedback components, being of a constant frequency with a relatively slow buildup in amplitude, will pass through the constant-phase delay network 90', through feedback control 100' to summing stage 96', and being in-phase with the input signal, will be integrated to a larger amplitude, will pass through amplitude control 104 and be differentially added to the input signal from input terminal 102, whereupon cancellation will occur in a materially effective amount, and therefore the feedback components of the signal will be materially reduced at the output terminal 104 compared to the speech components, thus permitting much greater freedom with the location of the microphone with respect to the speakers in the public address system, without materially affecting the quality of the speech components.

The network configurations hereinbefore described may be combined or cascaded in various arrangements in order to obtain desired results not possible in one operation. For example, amplitude variations within the device caused by imperfect implementation of the invention are exaggerated by the application of positive feedback and may prevent the attainment of large integration factors in one operation if the loop gain exceeds unity at some frequency. In such case, two or more networks may be cascaded to achieve the desired integration factor.

The foregoing is considered as illustrative only if the principles of the invention and may be applied by analogy to transmission of energy other than electrical energy where phase control is a problem. Further, since numerous modifications and changes will readily occur to those skilled in the art, it is not desired to limit the invention to the exact construction and operation shown and described, nor limit the uses of the invention to the examples given, and accordingly all suitable modifications and equivalents may be resorted to, falling within the scope of the invention.

What is claimed is as follows:

1. A method of maintaining a constant phase relationship between the input and output terminals of an energy transmission network having energy storing delay elements producing a change in phase of the transmitted energy with respect to an input frequency thereof, including the steps of: dividing the energy storing delay elements into separate portions respectively producing changes in phase of the transmitted energy with respect to an input frequency thereof; passing the transmitted energy through said divided delay portions in sequence; providing means to readjust the phase of the input frequency after it is passed through only a portion of the delay elements in order that the effect of the remaining delay portion on the phase of the input frequency is therefore cancelled so that the output phase of the resulting network exhibits substantially no net change in phase with respect to the input phase.

2. The method of claim 1 wherein said transmitted energy is a sinusoidally varied signal.

3. The method of claim 2 wherein said transmitted energy includes additional frequency components.

4. The method of claim 2 wherein said transmission network further includes a feedback path from the input terminal and summing means for adding the transmitted energy in the feedback path to perform an integration operation, including the step of: limiting the transmission of energy through said feedback path to feedback factor less than unity.

5. The method of claim 1 wherein said transmission network further includes a feedback path from the output terminal and summing means for adding the transmitted energy at the input terminal to the energy in the feedback path, to perform an integration operation, including the step of: limiting the transmission of energy through said feedback path to a feedback factor less than unity.

6. The method of claim 4 wherein said transmission network further includes means for adding the transmitted energy at the input and output terminals in phase opposition.

7. In combination with an energy transmission network having energy storing delay elements between input and output terminals, means interconnecting divided delay portions of the energy storing delay elements for maintaining a substantially constant phase relationship between the transmitted energy at said input and output terminals, comprising means for transmitting the energy at an input frequency in series through said divided delay portions of the energy storing delay elements, subtractive modulator means wherein the phase and/or frequency difference existing between the input and output of only one of the divided delay portions is compared, and additive modulator means wherein the output of said subtracting modulator is added to the said input of the divided delay portion to reverse the phase shift and/or frequency difference existing across said divided delay portion to the input frequency of said divided delay portion so as to compensate for the effect on the phase or frequency caused by the remaining delay portion so that the output of the said remaining delay portion will be substantially a delayed replica of the input frequency with yet substantially the same frequency and phase.

8. The combination of claim 7 wherein the transmitted energy includes additional frequency components, detector means for detecting the additional frequency components, and second constant-phase/frequency maintaining means connected between said detector means and one of the divided delay portions of the energy storing delay elements for producing a net change in phase with respect to the additional frequency components that is substantially equal to zero.

9. The combination of claim 7 wherein said phase/frequency correcting means is applied to either of the divided delay portions in sequence.

* * * * *